United States Patent
Yao et al.

(10) Patent No.: US 6,664,570 B1
(45) Date of Patent: Dec. 16, 2003

(54) P-TYPE CONTACT ELECTRODE DEVICE AND LIGHT-EMITTING DEVICE

(75) Inventors: Takafumi Yao, c/o Institute for Materials Research, Tohoku University 1-1, Katahira 2-chome, Aoba-Ku, Sendai City, Miyagi Pref. (JP); Meoung-Whan Cho, Sendai (JP)

(73) Assignees: NGK Insulators, Ltd., Nagoya (JP); Takafumi Yao, Sendai (JP)

( * ) Notice: Subject to any disclaimer, the term of this patent is extended or adjusted under 35 U.S.C. 154(b) by 0 days.

(21) Appl. No.: 09/535,044

(22) Filed: Mar. 27, 2000

(30) Foreign Application Priority Data

Jun. 25, 1999 (JP) ............................. 11-179282

(51) Int. Cl.$^7$ ..................... H01L 27/15; H01L 33/00; H01L 23/48
(52) U.S. Cl. .................. 257/79; 257/78; 257/94; 257/96; 257/103; 257/743; 257/744; 372/43; 438/602; 438/603
(58) Field of Search ............................ 257/78, 79, 744, 257/614, 201, 743, 745, 103, 94, 96; 372/43; 438/602, 603

(56) References Cited

U.S. PATENT DOCUMENTS 6,147,365 A * 11/2000 Fischer et al. ................ 257/78

OTHER PUBLICATIONS

P.M.Mensz, BeTe?ZnSe graded band gap phmic contacts to p–ZnSe, Appl. ohys. Lett., 64 (16), Apr. 18, 1994, pp 2148–2150.*

* cited by examiner

*Primary Examiner*—Tom Thomas
*Assistant Examiner*—Donghee Kang
(74) *Attorney, Agent, or Firm*—Burr & Brown

(57) ABSTRACT

A p-type contact electrode device in a ZnSe-based II–VI compound semiconductor, which electrode device uses, as a contact layer, a BeTe layer having a high p-type doping and a low lattice mismatching with a GaAs substrate to prevent oxidation in air. The device 2 includes a contact layer 5 composed of p-BeTe and a cap layer 4 is composed of p-ZnSe. The cap layer 4 is positioned on the contact layer 5 and an electrode 3 sits atop the cap layer. Preferably, the thickness of the cap layer is 30 to 70 Å and the electrode is composed of gold or gold is dispersed in the cap layer.

4 Claims, 5 Drawing Sheets

US 6,664,570 B1

P-TYPE CONTACT ELECTRODE DEVICE AND LIGHT-EMITTING DEVICE

BACKGROUND of the Invention

1. Field of the Invention

The present invention relates to the p-type contact electrode devices usable for the light emitters such as semiconductor lasers and light emitting diodes, and to the light emitters using such p-type contact electrode devices.

2. Related Art Statement

ZnSe-based semiconductor lasers have been investigated as blue and green light emitting elements ("Zn-Se based semiconductor lasers" in OPTRONICS, No. 4, pp 116–119, 1997). The semiconductor lasers and the light emitting diodes with short wavelengths ranging from green to blue have attracted attention as light sources for highly bright displays and optical recording apparatuses.

Group II–VI compounds composed of an element in Group II such as Zr, Be, Cd or Mg and an element in Group VI such as S, Se or Te are now expected to be practically used for semiconductor light emitters in the green-blue color range, such as semiconductor lasers and the light emitting diodes with short wavelengths ranging from green to blue.

Such a light emitter is usually formed by depositing thin layers such as p-type and n-type guide layers, and clad layers, an active layer, a contact layer and a cap layer on a substrate made of GaAs or the like according to a molecular beam epitaxy (MBE) method or a metal organic chemical vapor deposition (MOCVD) method.

In the former ZnSe-based light emitters, a p-ZnSe—ZnTe based device is used in a p-contact layer of a ZnSe-based II–VI blue-green laser diode to overcome the low conductivity of the p-type ZnSe and reduce the threshold voltage to less than 5 volts. However, as much as 7% lattice mismatch exists between ZnSe and p-ZnTe, so that misfit dislocation and strain occurs to raise a defect density thereof.

Former investigations on the degrading mechanism of the ZnSe laser diodes suggest that the strain caused by this contact layer plays an important role, and that a long life span is ensured by reducing the strain induced by an electrode. Based on such experiences, it can be presumed that the strain caused due to such a large lattice mismatching (7.1%) between ZnSe and ZnTe plays an important role for a degrading mechanism of the light emitting diode. For example, even if no dislocation exists in the layer at the beginning, it is anticipated that the misfit dislocation is caused by the large lattice mismatch during flowing current, when a long time passes, so that the misfit dislocation is introduced into the lower layer.

Be-based laser structural bodies have been proposed to prolong the life span of the II–VI ZnSe based bluish green laser devices. It is described that ZnSe/BeTe super lattices are used instead of ZnSe/p-ZnTe (Journal of Crystal Growth, 184/185, pp 1–10, 1998).

The present inventors examined the use of a single BeTe epitaxial layer as a p-type contact layer. The BeTe epitaxial layer has a high p-type doping property (about $10^{20} cm^{-3}$) and a lower lattice mismatch to a GaAs substrate (0.54%).

However, if a single BeTe layer is used as a p-type contact layer, it was clarified that the following problem existed.

For example, when an intermediate product was obtained by forming a BeTe epitaxial layer on a p-type clad layer of a light emitting layer and then this intermediate product was left in air for one month, a BeTe peak of a (004) X-ray locking arm curve completely disappeared. This is considered that since the Be chalcogenide is hygroscopic, the intermediate product was oxidized after absorption of moisture.

SUMMARY OF THE INVENTION

An object of the present invention is to provide a p-type contact electrode device in a ZnSe-based II–VI compound semiconductor in which a BeTe layer having a high p-type doping property and a lower lattice mismatch to a GaAs substrate is used as a contact layer to prevent the oxidation thereof in air.

(Countermeasure to Solve the Problems)

The present invention relates to the p-type contact electrode device in a ZnSe-based II–VI compound semiconductor, said p-type contact electrode device comprising a contact layer composed of a p-BeTe, a cap layer of a p-ZnSe on the contact layer and an electrode on the cap layer.

The present inventors' succeeded in preventing the oxidation of the contact layer by providing the BeTe contact layer and further providing the p-ZnSe cap layer on the contact layer through utilizing a high p-type doping property and a lower lattice mismatching to a GaAs substrate and an n-ZnSe substrate of the p-BeTe. By so doing, it was clarified that no degradation occurred in the contact layer in 2 to 3 weeks.

The thickness of the cap layer is particularly preferably 30 Å or more from the standpoint of view of preventing the oxidation of the contact layer. On the other hand, in order that the p-type contact electrode device may exhibit a preferable ohmic current-voltage characteristic, the thickness of the cap layer is preferably not more than 70 Å, more preferably not more than 60 Å.

A material for the electrode to directly contact the cap layer is preferably gold, platinum, palladium or an alloy thereof.

DETAILED DESCRIPTION OF THE INVENTION

Particularly when tie electrode is made of gold, it was discovered that the entire p-type contact electrode device exhibits an extremely linear ohmic current-voltage characteristic.

That is, the cap layer can function as a barrier for the contact layer made of highly p-doped BeTe when holes are to be injected. With respect to a one-dimensional rectangular energy barrier, decrease in the thickness of the barrier monotonously increases the quantum tunneling probability, irrespective of the height and thickness of the barrier.

Figure 1:
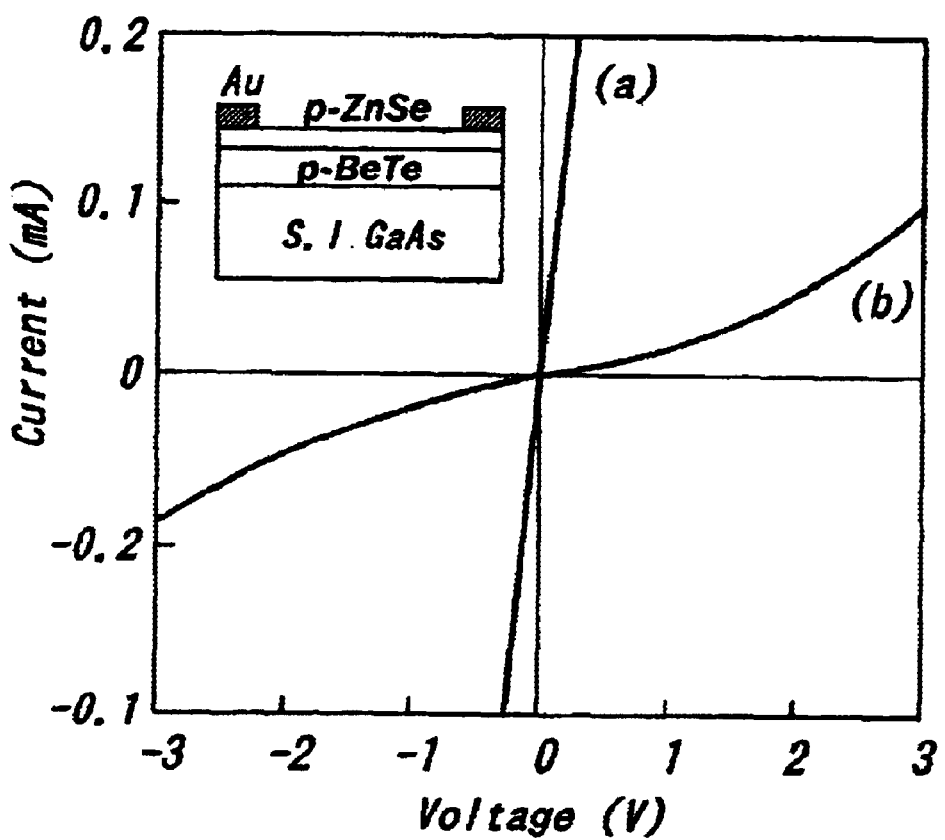
FIG. 1 shows the current-voltage characteristics of the cap layer of the p-type contact electrode device according in which the thickness of the cap layer is varied between graphs (a) and (b).

The present inventors handled the cap layer made of ZnSe as a barrier, and noted the thickness of the cap layer. As schematically shown in FIG. 1, a contact layer made of BeTe and a cap layer of nitrogen-doped ZnSe were grown on a GaAs substrate according to the molecular beam epitaxy method, and an electrode made of gold was grown on the cap layer. Then, the state of the ZnSe cap layer was observed by using a TEM (transmission electron microscope). Further, a specific contact resistance of the gold/p-ZnSe/p-BeTe contact electrode device was measured by using a transmission linear model (TLM) pattern.

A BeTe:N epitaxial layer was grown on a GaAs substrate oriented in a direction of (001) by using raw source materials of Te (6N) and Be (4N) according to the molecular beam epitaxy method. The present inventors systematically grew BeTe epitaxial layers without a GaAs buffer layer.

The growing conditions are as follows. The growing temperature was 300° C., and the growing speed was typically 0.1 $\mu$m/h. While the ratio of anions (Te) to cations (Be) was adjusted, a slight anion-stabilized surface was given under interruption with a diffusion (2×1) reflection high-energy electron diffraction (RHEED) pattern.

The present inventors discovered through the measurements with the X-ray diffraction method and the interelectron force microscope that an optimum growing condition was reached for BeTe under a Te-stabilized growing condition. A high frequency plasma source was employed for nitrogen doping. In order that a readout in an ion gauge may be in a range of $5.0 \times 10^{-7} \sim 1.2 \times 10^{-7}$ Torr, the flow rate of nitrogen was adjusted, while the output of the nitrogen plasma was held at 250 W. In order to prevent the oxidation of the BeTe grown, a ZnSe:N cap layer was heaped on this epitaxial layer. The thickness of the cap layer was evaluated by using a high resolution transmission electron microscope (HRTEM: JEM-4000 EX microscope). The specific contact resistance was evaluated by using the TLM pattern. This TLM pattern had been produced by a standard photolithography method. In order to form a contour of a contact area between the gold electrode and the cap layer, $SiO_2$ was heaped, instead of chemical etching, for suppressing parasitic current.

Although the BeTe: N was highly doped to $1.3 \times 10^{19}$ $cm^{-3}$, it revealed crystallinity comparable to that in a case of a half-width value of less than 100 (arc-sec) in a (004) X-ray locking curve. Such high crystallinity of the BeTe: N is attributable to high reproducibility, in flux controlling, owing to low lattice mismatching (0.47%) between the GaAs substrate and a low vapor pressure of the Be source.

Cap layers were grown in various thicknesses on p-BeTe layers. The electric characteristic of the p-ZnSe/p-BeTe was evaluated by the van del Pauw method. The hole density and the mobility were typically $1.9 \times 10^{19}$ $cm^{-3}$ and 46 $cm^2$/Vs, respectively. The thicknesses of the ZnSe cap layers were accurately controlled by using the atomic layer epitaxy method, and confirmed by TEM. The thickness of the contact electrode made of gold was about 1500 Å, which was continuously vapor deposited in an electron beam vapor deposition apparatus.

With respect to these experiments, FIG. 1 shows current-voltage curves when the thickness of the cap layer was 50 $\mu$m (graph (a)) or 140 Å (graph (b)). As seen from the graph (a) in FIG. 1, when the cap layer was 50 $\mu$m thick, extremely excellent ohmic contact was realized. However, when the p-ZnSe cap layer was 140 Å thick, a Shottky barrier (about 1.6 eV) occurs at an interface between gold and the cap layer to result in a non-linear current-voltage curve. Such a current-voltage curve strongly depends upon the thickness of the cap layer. Concretely, it was revealed that the cap layer is preferably in the above mentioned thickness range.

It was revealed that the above ohmic current-voltage characteristic appears owing to two factors. First, a main current is constituted by tunnel holes injected through the Shottky barrier between the electrode and the cap layer. Second, diffusion of gold in the cap layer promotes the current due to the tunnel holes projecting into the p-BeTe contact layer through the cap layer.

In order to examine the relationship between the thickness of the cap layer and the diffused depth of the gold, a contact layer (about 500 Å thick) and a cap layer (about 50 Å thick) were grown on a GaAs substrate, and an electrode of gold was heaped thereon (1500 Å thick).

Figure 2:
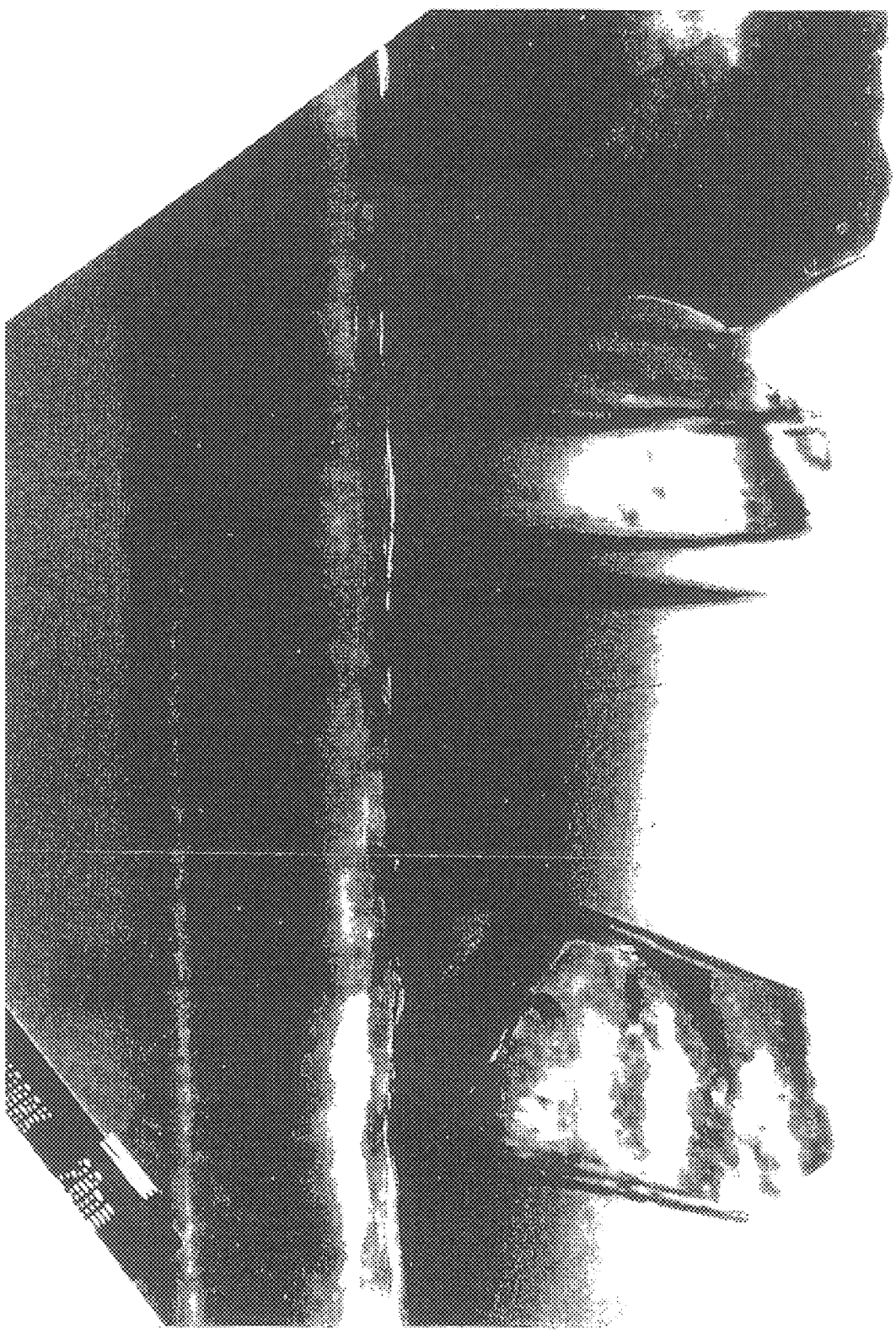
FIG. 2 is a result of TEM of a test sample of the p-type contact electrode device according to the present invention.
Figure 3:
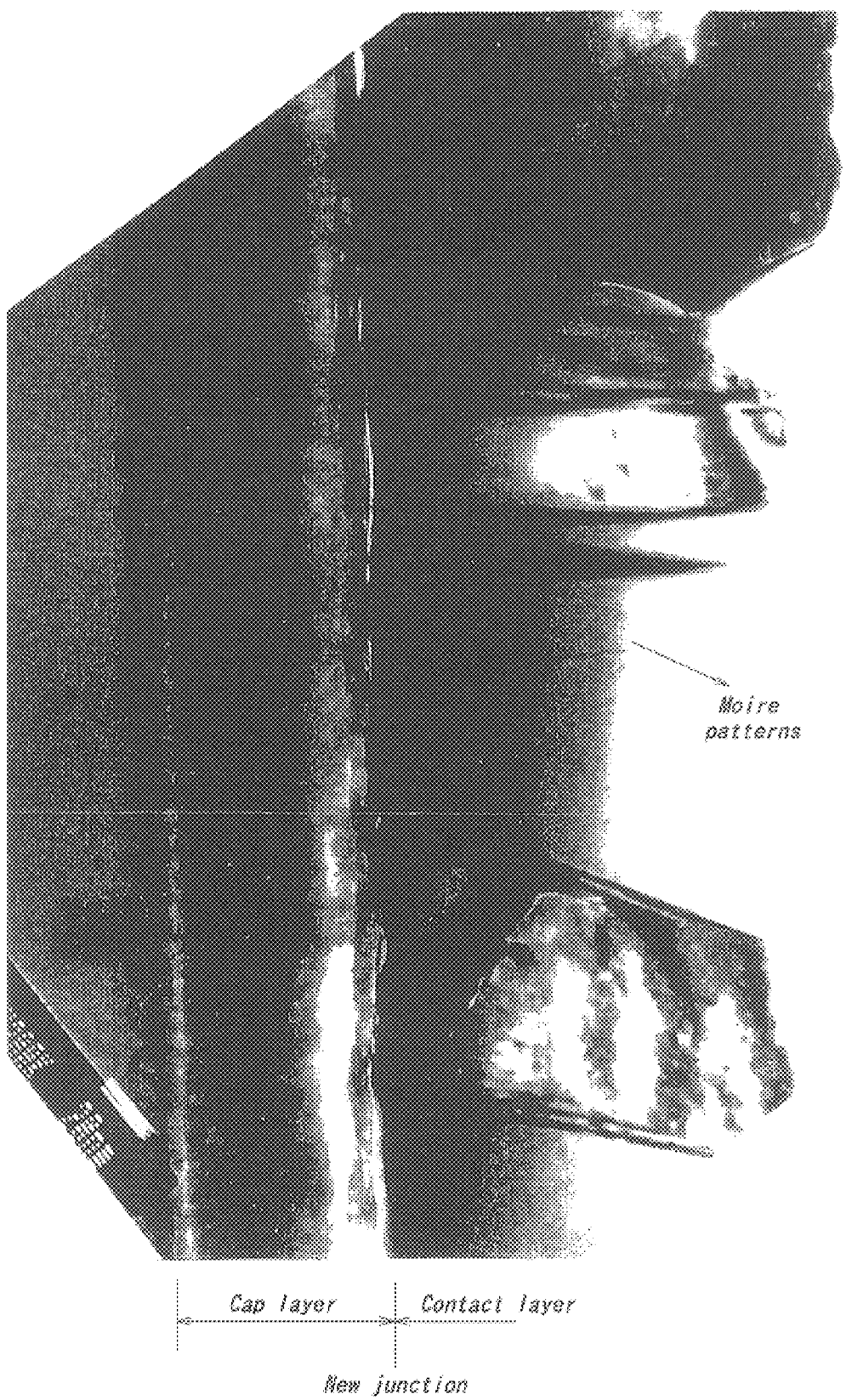
FIG. 3 is an illustrative view of FIG. 2.

FIG. 2 is a photograph showing a result of a TEM for this sample. The thickness of the cap layer was accurately controlled to about 50 Å and the gold was diffused up to an interface between the cap layer and the contact layer through the former. In FIG. 2, peculiar differences are recognizable in contrast near the interface range of the cap layer and the contact layer owing to deviations in concentration of the gold. A number of Moire patterns can be observed in a shallow zone of the contact layer (p-BeTe) from the interface. This Moire pattern reflects the gradient of the concentration of gold from the interface, and represents the self diffusion of gold. As the gold diffuses into the contact layer, a new junction is formed between the contact layer and the cap layer into which gold is highly diffused.

The diffusion depth into the contact layer was limited by the thickness of the cap layer. As shown in FIG. 1, this means that the current-voltage curve is influenced by the thickness of the cap layer. An offset in the valence electron band between the contact layer and the cap layer into which gold is highly doped can be fully overcome by the contact layer highly doped to about $10^{-9}$ $cm^{-3}$ or more. In the contact layer doped at such a concentration, a defect width is too small to allow passage of a carrier through the barrier owing to the tunnel effect.

As mentioned above, according to the p-type contact electrode device as a preferable embodiment of the present invention, the ohmic characteristic can be realized through the self diffusion of gold into the contact layer without undergoing an alloying process at all.

The present inventors formed a low-resistance ohmic contact for a cap layer (p-ZnSe: about 50 Å thick), a contact layer (p-BeTe: about 0.5 $\mu$m) and a GaAs substrate for the preparation of a TLM measurement sample. Specifically, (1) a contour of a contact region was formed by heating $SiO_2$ according to a standard photolithography method or lift-off method (2000 Å thick), and (2) gold was finally heaped (1500 Å thick) on the thus formed contour of the contact region.

Figure 4B:
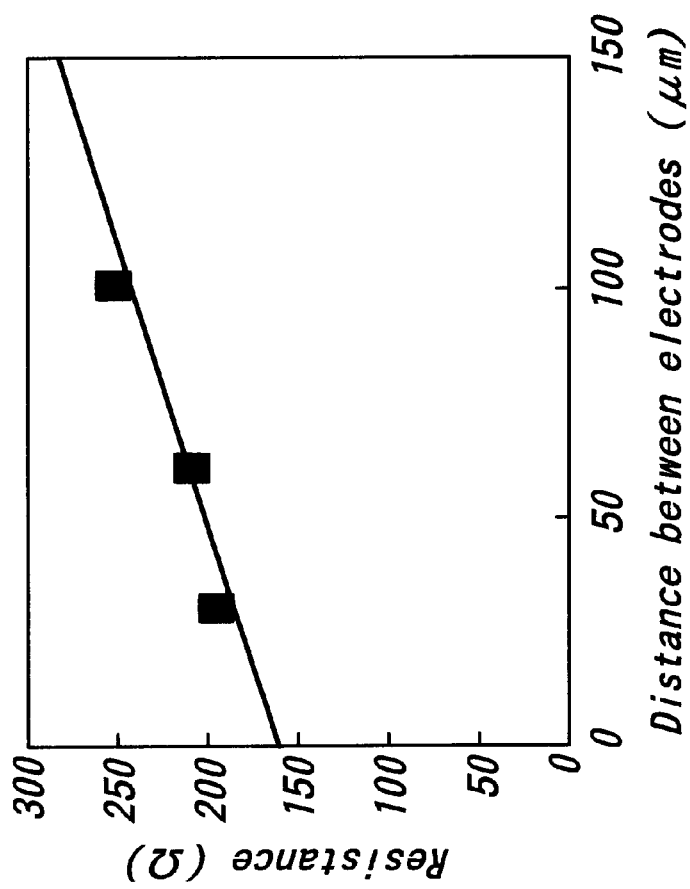
FIG. 4(b) is a graph showing the relationship between the interval of electrodes and the resistance.
Figure 4A:
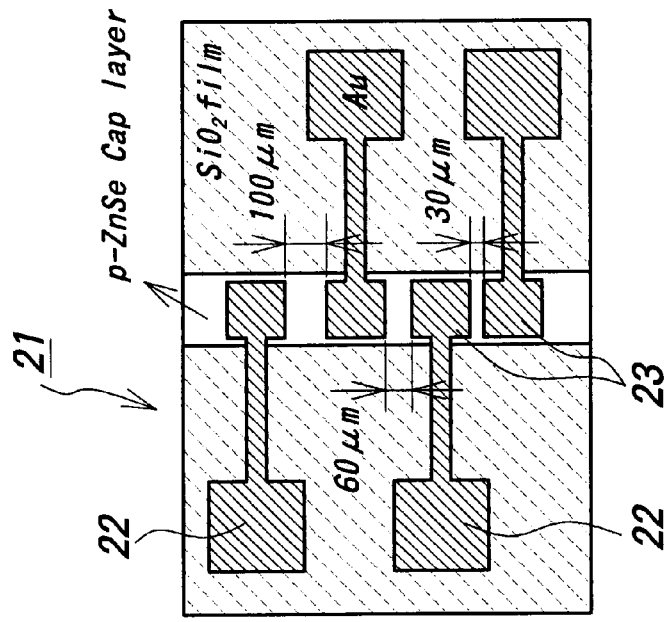
FIG. 4(a) is a schematic view of a plane structure of a test sample 21.

As schematically shown in FIG. 4(a), the inventors designed contact regions 22 and 23 having two sizes on the sample 21. That is, 500×500 $\mu m^2$ and 800×800 $\mu m^2$. The smaller contact region 23 contacts the surface of the cap layer, whereas the larger one 22 easily contacts a chip. The resistance between the contacts was measured as a function of a distance L between them at room temperature in a voltage range of −1.5 to +1.5 volts according to a standard direct current technique. In FIG. 4(b), the entire resistance was plotted as a function of the resistance between the electrode (30 $\mu$m, 60 $\mu$m and 100 $\mu$m) in the form of solid squares. Further, a result (solid line) approximated by the least square method is also shown according to the presumption of transition linear models.

As seen from the above results, the p-type contact electrode device according to the present invention is useful as a p-type contact structure in a compound semiconductor light emitting device having ZnSe as a base.

As mentioned above, the thickness of the cap layer being not more than 70 μm is most effective for the diffusion of gold into the cap layer. However, even if the cap layer is thicker of than 70 μm, the above current contribution due to the above mentioned projecting tunnel holes can be obtained so long as the gold diffuses over the entire cap layer and is also diffused in a shallow surface portion of the contact layer.

So long as the ZnSe-based II–VI compound semiconductor light emitter according to the present invention employs the above mentioned p-type contact electrode device, no limitation is posed upon other p-type clad layer, light emission-active layer, n-type clad layer and substrate.

However, the n-type clad layer on the substrate preferably includes at least one layer of an n-(BeMgZn)Se compound, and the light emission-active layer preferably comprises BeZnCdSe or BeZnSeTe. The p-type clad layer preferably includes at least one layer of an p-(BeMgZn)Se compound, and the substrate preferably comprises n-GaAs or n-ZnSe.

Figure 5:
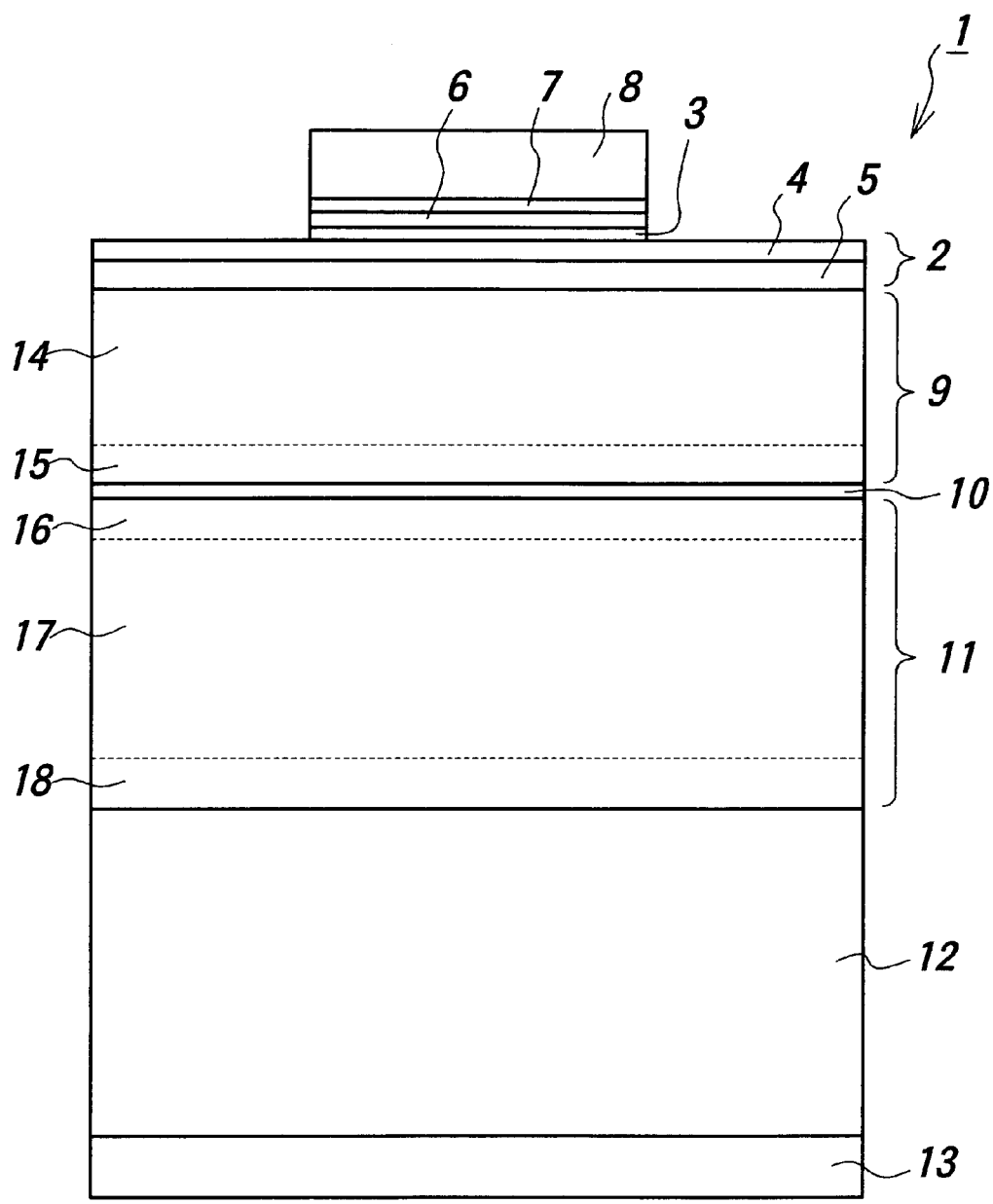
FIG. 5 is a schematic view of a light emitting device 1 according to the present invention.

FIG. 5 shows a schematic view of such a light emitter. An n-type contact layer 13 is provided under a substrate 12 made of n-GaAs or n-ZnSe. An n-clad layer 11, a light emission-active layer 10, a p-type clad layer 9, a contact layer 5, a cap layer 4, and electrodes 3, 6, 7, 8 are successively formed on the substrate 12. The p-type contact electrode device is denoted by 2.

The n-type clad layer 11 most preferably comprises an n-(BeZn)Se layer 18, an n-(BeMgZn)Se layer 17 and a (BeZn)Se layer 16. As each of the layers, a material known to a skilled person in the art as that for the n-type clad layers in the II–VI compound semiconductor light-emitters may be used.

The p-type clad layer 9 particularly preferably comprises a p-(BeZn)Se layer 15, and a p-(BeMgZn)Se layer 14. As each of the layers, a material known to a skilled person in the art as that for the p-type clad layers in the II–VI compound semiconductor light-emitters may be used.

The electrode layers 3, 6, 7 and 8 are single metallic layers or metallic multi-layers of gold, platinum and palladium, respectively, or preferably an alloy film of gold, platinum and palladium or most preferably an alloy film of gold and platinum.

The light emitter according to the present invention can be favorably used for the bluish green or blue semiconductor lasers and the light emitting diodes. Further, blue light or bluish green light emissions obtained by the light emitters according to the present invention can be converted to a shorter-wavelength light such as second harmonic waves or third harmonic waves.

(Effects of the Invention)

As mentioned above, according to the present invention, the p-type contact electrode device in the ZnSe-based II–VI compound semiconductor is provided, in which the BeTe layer having a high p-type doping property and a lower lattice mismatching to the GaAs substrate is used as the contact layer and the oxidation of the contact layer is prevented.

What is claimed is:

1. A semiconductor light emitter comprising:

a substrate composed of n-GaAs or n-ZnSe;

an n-type clad layer on the substrate, said clad layer comprising at least one layer of an n-(BeMgZn)Se compound;

a light emission-active layer on the n-type clad layer, said light emission-active layer comprising BeZnCdSe or BeZnSeTe;

a p-type clad layer on the light emission-active layer, said clad layer comprising at least one layer of a p-(BeMgZn)Se compound; and a p-type contact electrode comprising a Contact layer composed of p-BeTe, a cap layer composed of p-ZnSe on the contact layer, said cap layer having a thickness of 30 to 70 Å, and an electrode on the cap layer, wherein said contact layer contacts said layer of the p-(BeMgZn)Se compound.

2. The semiconductor light emitter set forth in claim 1, wherein the electrode comprises gold.

3. The semiconductor light emitter set forth in claim 1, wherein the electrode comprises gold, and gold is dispersed in the cap layer.

4. A semiconductor light emitter, comprising:

a substrate composed of n-GaAs or n-ZnSe;

an n-type clad layer on the substrate, said clad layer comprising at least one layer of an n-(BeMgZn)Se compound;

a light emission-active layer on the n-type clad layer, said light emission-active layer comprising BeZnCdSe or BeZnSeTe;

a p-type clad layer on the light emission-active layer, said clad layer comprising at least one layer of a p-(BeMgZn)Se compound; and a p-type contact electrode comprising a contact layer composed of p-BeTe, a cap layer composed of p-ZnSe on the contact layer and an electrode on the cap layer, wherein said contact layer contacts said layer of p-(BeMgZn)Se compound, said electrode comprises gold, and gold is dispersed in the cap layer.

* * * * *